(12) United States Patent
Gu et al.

(10) Patent No.: US 10,777,463 B2
(45) Date of Patent: Sep. 15, 2020

(54) FORMATION OF EPI SOURCE/DRAIN MATERIAL ON TRANSISTOR DEVICES AND THE RESULTING STRUCTURES

(71) Applicant: GLOBALFOUNDRIES Inc., Grand Cayman (KY)

(72) Inventors: Man Gu, Malta, NY (US); Tao Han, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 5 days.

(21) Appl. No.: 16/247,761

(22) Filed: Jan. 15, 2019

(65) Prior Publication Data

US 2020/0227320 A1    Jul. 16, 2020

(51) Int. Cl.
| | |
|---|---|
| H01L 21/8234 | (2006.01) |
| H01L 27/088 | (2006.01) |
| H01L 27/092 | (2006.01) |
| H01L 29/417 | (2006.01) |
| H01L 21/8238 | (2006.01) |
| H01L 29/78 | (2006.01) |
| H01L 29/66 | (2006.01) |

(52) U.S. Cl.
CPC ........ *H01L 21/823418* (2013.01); *H01L 21/823431* (2013.01); *H01L 21/823468* (2013.01); *H01L 21/823821* (2013.01); *H01L 21/823864* (2013.01); *H01L 27/0886* (2013.01); *H01L 27/0924* (2013.01); *H01L 29/41791* (2013.01); *H01L 29/66795* (2013.01); *H01L 29/785* (2013.01)

(58) Field of Classification Search
CPC ....... H01L 21/823418; H01L 29/41791; H01L 21/823821; H01L 21/823468; H01L 21/823431; H01L 29/785; H01L 27/0924; H01L 27/0886; H01L 29/66795; H01L 21/823864
See application file for complete search history.

(56) References Cited

U.S. PATENT DOCUMENTS

| | | | |
|---|---|---|---|
| 6,946,350 B2 | 9/2005 | Lindert et al. | |
| 8,198,194 B2 | 6/2012 | Yang et al. | |
| 8,450,194 B2 | 5/2013 | Waite et al. | |
| 2015/0364601 A1* | 12/2015 | Kuang | ............... H01L 29/0847 257/369 |

* cited by examiner

*Primary Examiner* — Julia Slutsker
(74) *Attorney, Agent, or Firm* — Amerson Law Firm, PLLC (57) ABSTRACT

One illustrative device disclosed herein includes an epi cavity formed in a semiconductor substrate adjacent a gate structure of a transistor and an epi semiconductor material comprising first and second portions. The first portion of the epi semiconductor material is positioned within the epi cavity. The second portion of the epi semiconductor material is positioned above the first portion of the epi semiconductor material and above a level corresponding to a level of an upper surface of the semiconductor substrate. The first portion of the epi semiconductor material has a first dimension in a direction corresponding to a gate length direction of the transistor and the second portion of the epi semiconductor material has a second dimension in a direction corresponding to the gate length direction of the transistor, wherein the first dimension is greater than the second dimension.

18 Claims, 10 Drawing Sheets

FORMATION OF EPI SOURCE/DRAIN MATERIAL ON TRANSISTOR DEVICES AND THE RESULTING STRUCTURES

BACKGROUND

1 Field of the Disclosure

The present disclosure generally relates to the fabrication of semiconductor devices, and, more particularly, to various novel methods of forming epi source/drain material on transistor devices and corresponding integrated circuit products.

2. Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices. A transistor typically includes a conductive gate structure, a source region and a drain region.

In order to function properly, separate conductive electrical paths are formed for the conductive gate structure, the source region and the drain region of the transistor. One or more insulating sidewall spacers are positioned adjacent the sidewalls of the gate structure. Typically, epi semiconductor material is formed in the source/drain regions of the transistor device adjacent the sidewall spacer. Thereafter, some type of conductive source/drain metallization structures, e.g., trench silicide (TS) structures, are formed on the epi semiconductor material. As a result of the physical configuration of the transistor, a gate-to-S/D capacitor is defined, wherein the gate electrode functions as one of the conductive plates of the capacitor, the combination of the conductive source/drain structure/epi material functions as the other conductive plate of the capacitor and the sidewall spacer is the insulating material positioned between the two conductive plates. This gate-to-S/D capacitor is parasitic in nature in that this capacitor must charge and discharge every time the transistor device is turned on and off, all of which results in delaying the switching speed of the device. As device dimensions continue to decrease, this parasitic resistance and capacitance may be even more problematic for future transistor devices.

The present disclosure is directed to various novel methods of forming epi source/drain material on transistor devices and corresponding integrated circuit products that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming epi source/drain material on transistor devices and corresponding integrated circuit products. One illustrative method disclosed herein may include forming a sacrificial sidewall spacer adjacent the sidewalls of a gate structure of the transistor, forming an epi cavity in the semiconductor substrate and performing a selective deposition process to form a first sacrificial material selectively on at least the sacrificial sidewall spacer. In this embodiment, the method may also include forming an epi semiconductor material in the epi cavity, removing the first sacrificial material and the sacrificial sidewall spacer and forming at least one final sidewall spacer adjacent the sidewall of the gate structure, wherein a portion of the at least one final sidewall spacer is positioned laterally between a portion of the epi material and the gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming epi source/drain material on transistor devices and corresponding integrated circuit products. The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, etc. As will be appreciated by those skilled in the art after a complete reading of the present application, the methods and devices disclosed herein may be employed in forming integrated circuit products using transistor devices in a variety of different configurations, e.g., planar devices, FinFET devices, etc. The gate structures of the transistor devices may be formed using either "gate first" or "replacement gate" manufacturing techniques. Thus, the presently disclosed subject matter should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail.

FIGS. 1-20 are drawings that depict various novel methods of forming epi source/drain material in the source/drain regions of transistor devices and corresponding integrated circuit products. The cross-sectional drawings included herein are taken through a plurality of PFET transistor devices 101P and a plurality of NFET transistor devices 101N formed in and above a semiconductor substrate 102. The cross-sectional views are taken through the transistor devices 101P, 101N in a direction corresponding to the gate-length (GL) direction, i.e., the current transport direction, of the transistor devices 101P, 101N. The transistor devices 101P, 101N disclosed herein may be of any type, form, shape or configuration, e.g., planar transistor devices, FinFET devices, etc. In the case where the transistor devices 101P, 101N are FinFET devices, the cross-sectional views depicted herein should be understood to be views taken through the long axis of a fin of such a FinFET transistor device. It should be noted that the drawings depicted herein are not to scale. Additionally, various doped regions, e.g., halo implant regions, well regions and the like, are not depicted in the attached drawings.

The semiconductor substrate 102 may have a variety of configurations, such as the depicted bulk silicon configuration. The substrate 102 may also have a semiconductor-on-insulator (SOI) configuration that includes a base semiconductor layer, a buried insulation layer formed on the base semiconductor layer and an active layer formed on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the depicted example, three illustrative PFET transistors 101P (the gate structures being labeled 1-3 for ease of reference) and three illustrative NFET transistors 101N (the gate structures being labeled 4-6 for ease of reference) will be formed on the semiconductor substrate 102. The gate structures for the transistor devices 101P, 101N may be formed using known gate-first or replacement-gate manufacturing techniques. In the examples depicted herein, the gate structures for the transistor devices 101P, 101N will be depicted as being formed by performing known replacement-gate manufacturing techniques. In the illustrative example depicted herein, the novel methods disclosed herein will be performed to form epi semiconductor material in the source/drain regions of the PFET transistors 101P. However, as will be appreciated by those skilled in the art after a complete reading of the present application, the methods disclosed herein may also be performed to form epi semiconductor material in the source/drain regions of the NFET transistors 101N as well.

Figure 1:
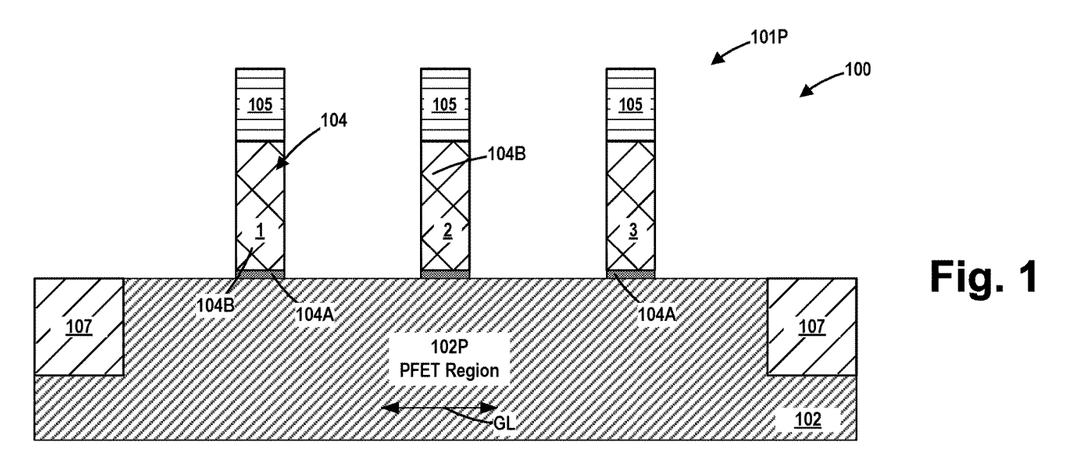
FIGS. 1-20 are drawings that depict various novel methods of forming epi source/drain material on transistor devices and corresponding integrated circuit products.
Figure 2:
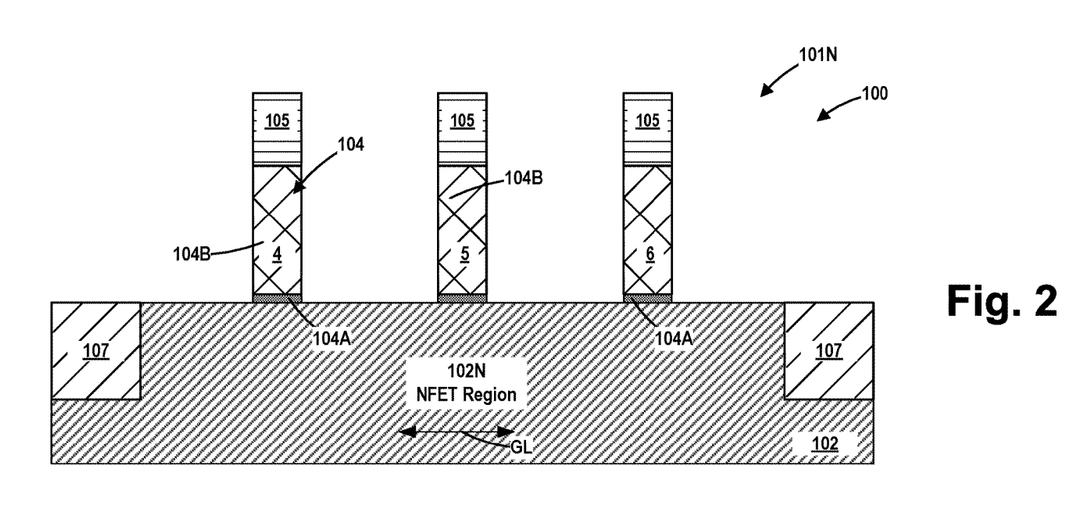

FIGS. 1 and 2 depict an IC product 100 after several process operations were performed. First, isolation regions 107 were formed in the substrate 102 to define a PFET region 102P and an NFET region 102N in the substrate 102 that are electrically isolated from one another. The PFET transistors 101P will be formed in the PFET region 102P, while the NFET transistors 101N will be formed in the NFET region 102N. The isolation regions 107 may be formed by forming trenches in the substrate 102 and thereafter filling the trenches with an insulating material, e.g., silicon dioxide, using known manufacturing techniques.

Still referencing FIGS. 1-2, a plurality of sacrificial (or "dummy") gate structures 104, with a sacrificial gate cap 105 formed thereabove, were formed across the substrate 102. In one illustrative and non-limiting process flow, each of the sacrificial structures 104 comprises a sacrificial gate insulation layer 104A (e.g., silicon dioxide) and a sacrificial gate electrode material 104B (e.g., polysilicon or amorphous silicon). A sacrificial gate cap 105 (e.g., silicon nitride) is positioned above each of the sacrificial gate structures 104. In one illustrative process flow, the sacrificial gate structures 104 (with the gate cap 105 thereabove) are initially formed as continuous line-type structures that extend across substantially the entire substrate 102. The long continuous line-type sacrificial gate structure 104/gate cap 105 structures may be formed by depositing the materials for the sacrificial gate structures 104 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials.

Figure 3:
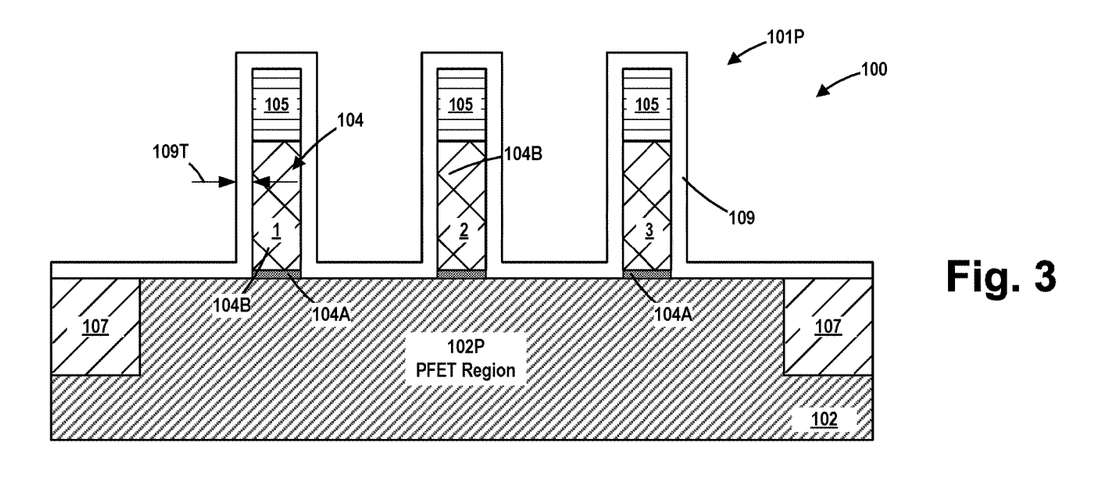
Figure 4:
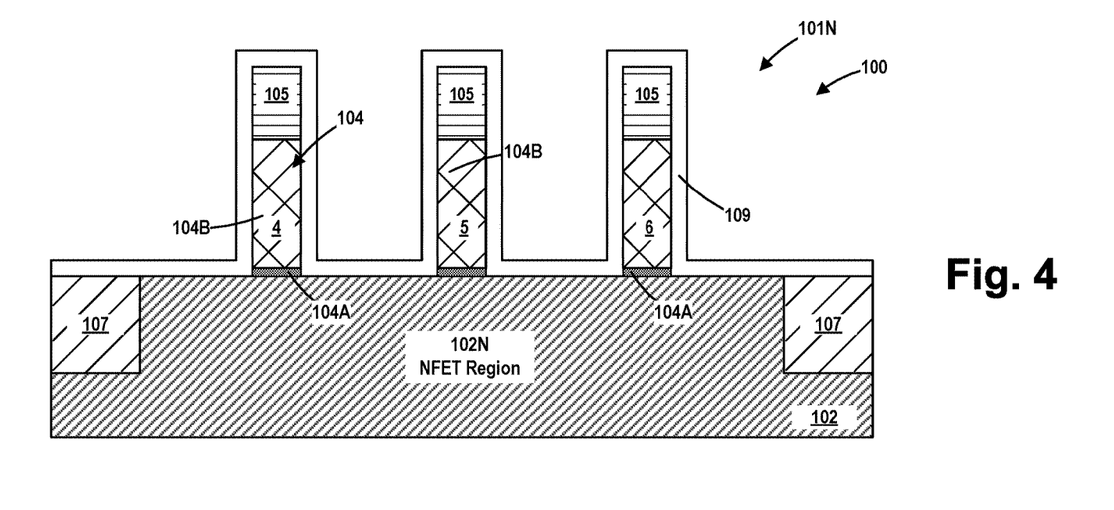

FIGS. 3-4 depict the product 100 after a conformal deposition process was performed to form a first conformal layer of sacrificial material 109 across the substrate 102 including in the PFET region 102P and in the NFET region 102N. The first conformal layer of sacrificial material 109 may be comprised of a variety of different materials, e.g., silicon nitride, or a multi-layer structure (such as, for example, a silicon dioxide/silicon nitride layer wherein the outermost layer is silicon nitride), etc., and it may be formed to any desired thickness 109T, e.g., 2-3 nm based upon current-day technology.

Figure 5:
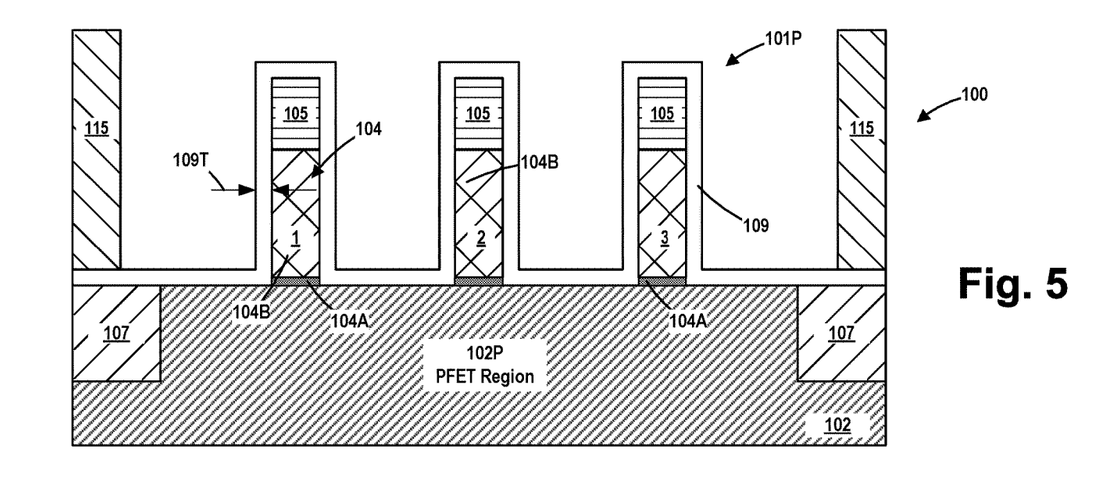
Figure 6:
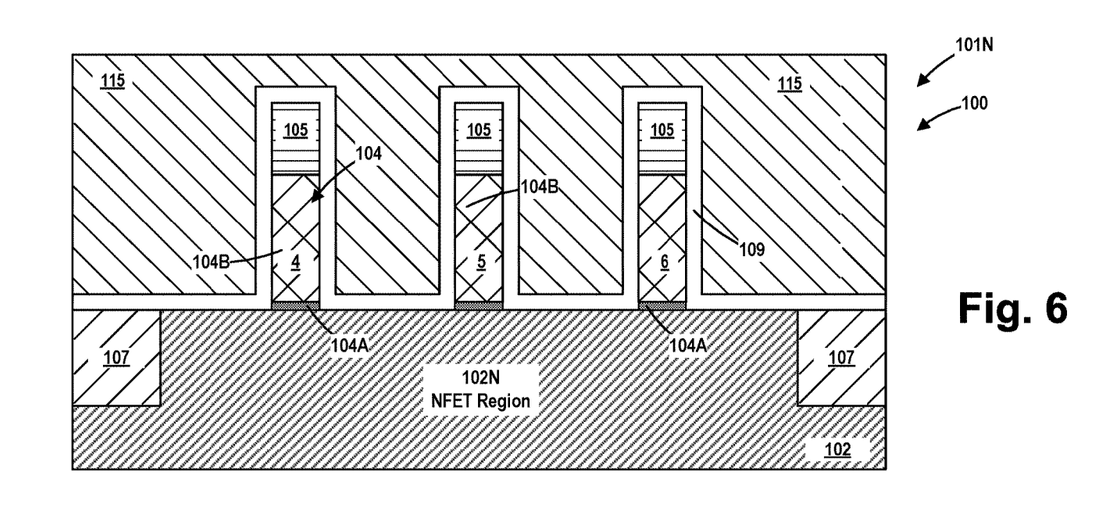

FIGS. 5 and 6 depict the IC product 100 after a patterned etch mask layer 115, e.g., photoresist, OPL, etc., was formed above the product 100. As depicted, the patterned etch mask covers the NFET transistors 101N while leaving the PFET transistors 101P exposed for further processing operations.

Figure 7:
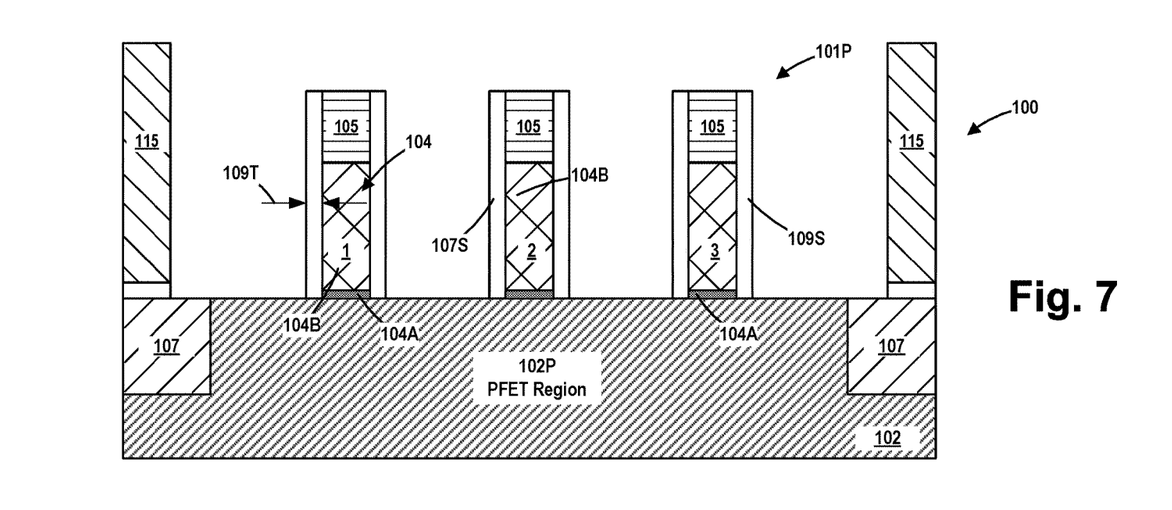
Figure 8:
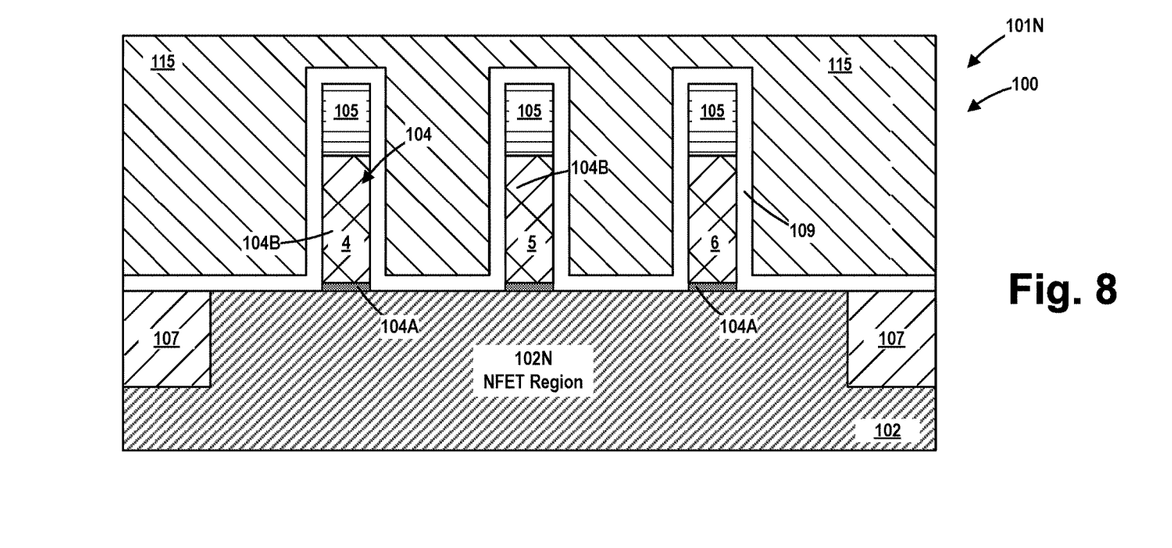

FIGS. 7 and 8 depict the IC product 100 after an anisotropic etching process was performed to remove portions of the conformal layer of sacrificial material 109. This process operation results in the formation of a sacrificial sidewall spacer 109S that is positioned against the gate structures 1-3 of the PFET transistors 101P. Note that the conformal layer of sacrificial material 109 remains positioned intact in the NFET region 102N.

Figure 9:
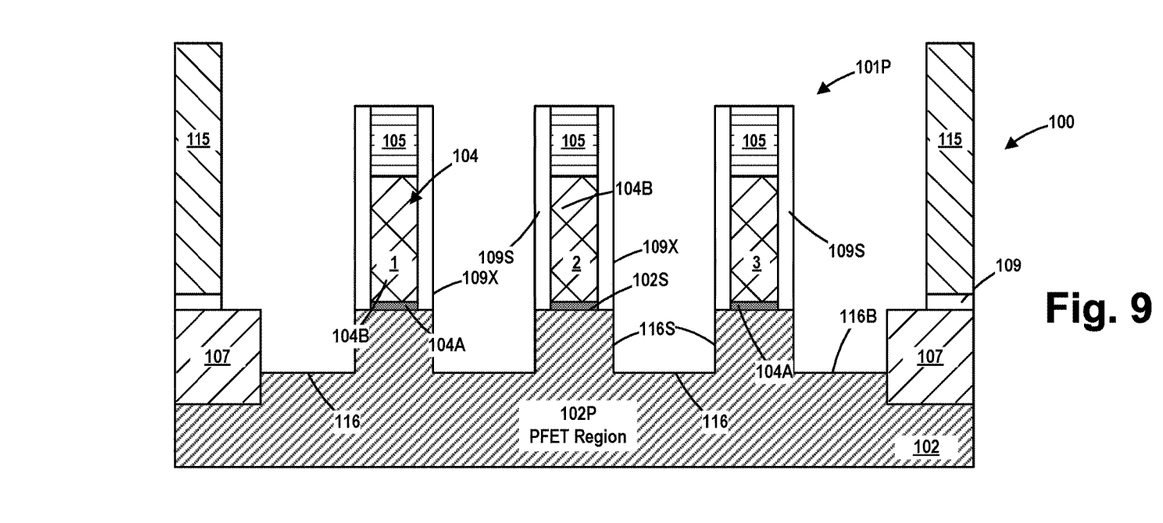
Figure 10:
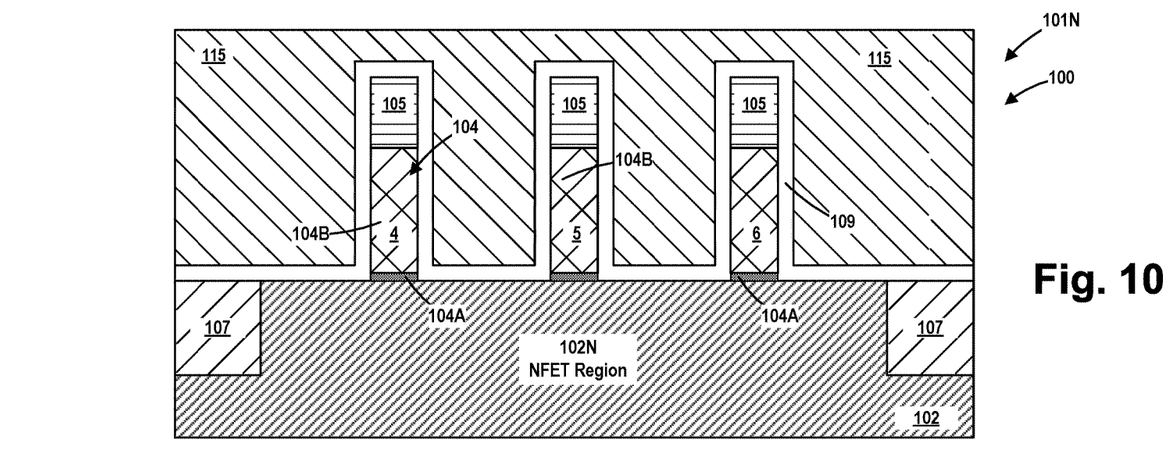

FIGS. 9 and 10 depict the IC product 100 after an anisotropic etching process was performed to remove portions of the substrate 102 in the source/drain regions of the PFET transistors 101P. This process operation results in the formation of a plurality of epi cavities or epi recesses 116 in the substrate 102 adjacent the gates 1-3 of the PFET transistors 101P. In one illustrative example, based upon current-day technology, the depth of the epi cavities 116 may be about 50-60 nm. Note that, in one illustrative example, due to the nature of the anisotropic etching process, the epi cavities 116 may comprise substantially vertically oriented sidewalls 116S and a substantially planar bottom surface 116B that is oriented substantially normal to the substantially vertically oriented sidewalls 116S of the epi cavity 116. Also note that the substantially vertically oriented sidewalls 116S are substantially aligned with an outer surface 109X of the sacrificial sidewall spacer 109S.

Figure 11:
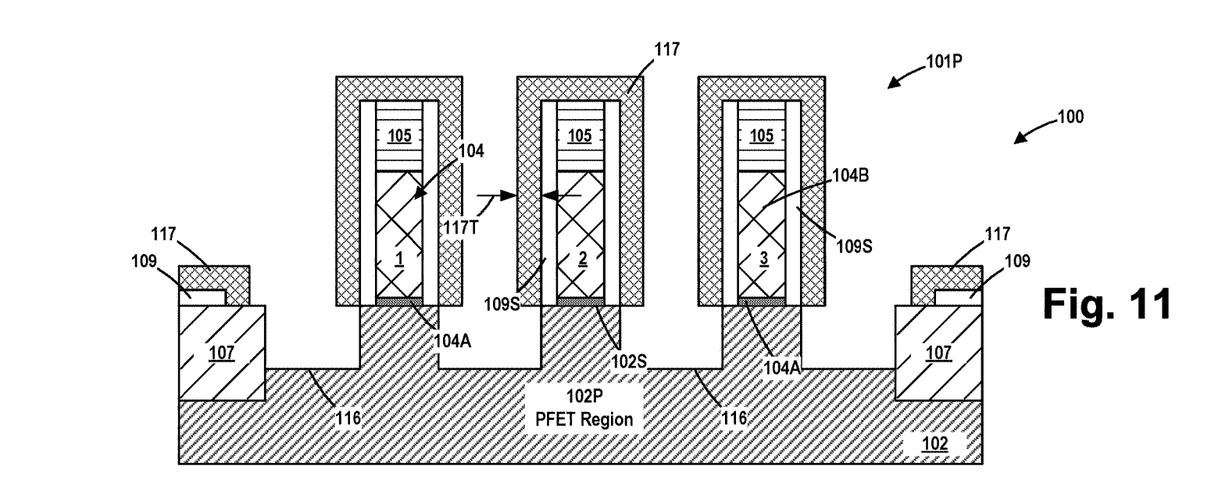
Figure 12:
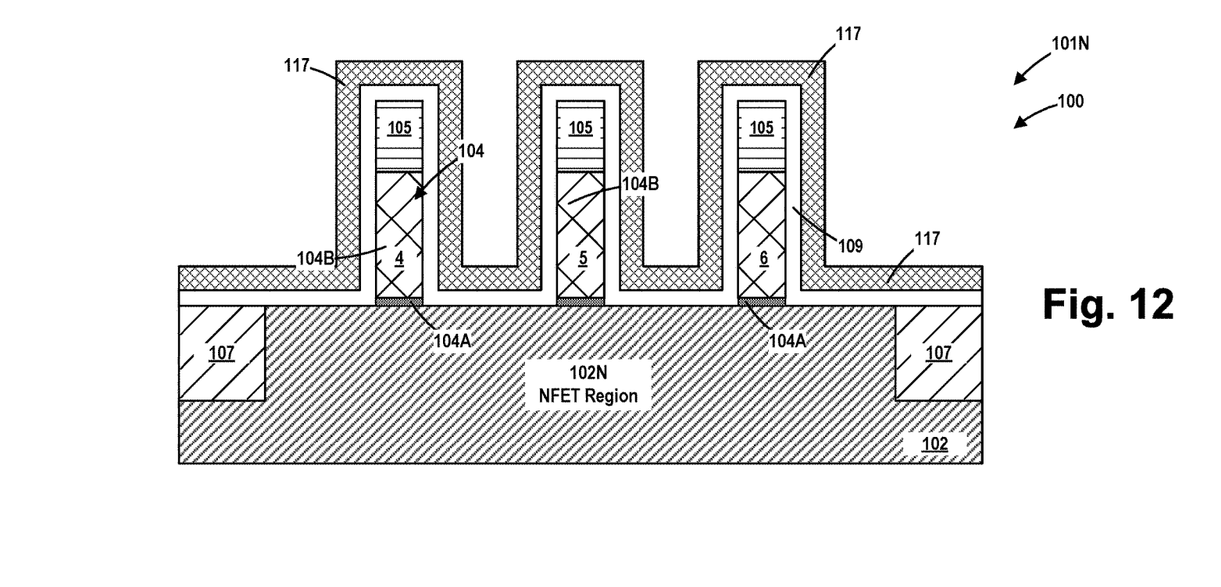

FIGS. 11 and 12 depict the IC product 100 after several process operations were performed. First, the patterned etch mask layer 115 was removed and a general cleaning process was thereafter performed on the product 100. Next, a selective deposition process was performed to form a layer of sacrificial material 117 in both the PFET region 102P and the NFET region 102N. As indicated, the layer of sacrificial material 117 only forms (to any appreciable extent) on the first conformal layer of sacrificial material 109 and the exposed portion of the silicon nitride gate cap 105. The layer of sacrificial material 117 may be comprised of a variety of different materials, e.g., silicon nitride, etc., and it may be formed to any desired thickness 117T, e.g., 5-7 nm based upon current-day technology. Note that, due to the uniform presence of the conformal layer of sacrificial material 109 in the NFET region 102N, the layer of sacrificial material 117 forms as a conformal layer of the sacrificial material 117 across the entirety of the NFET region 102N.

Figure 13:
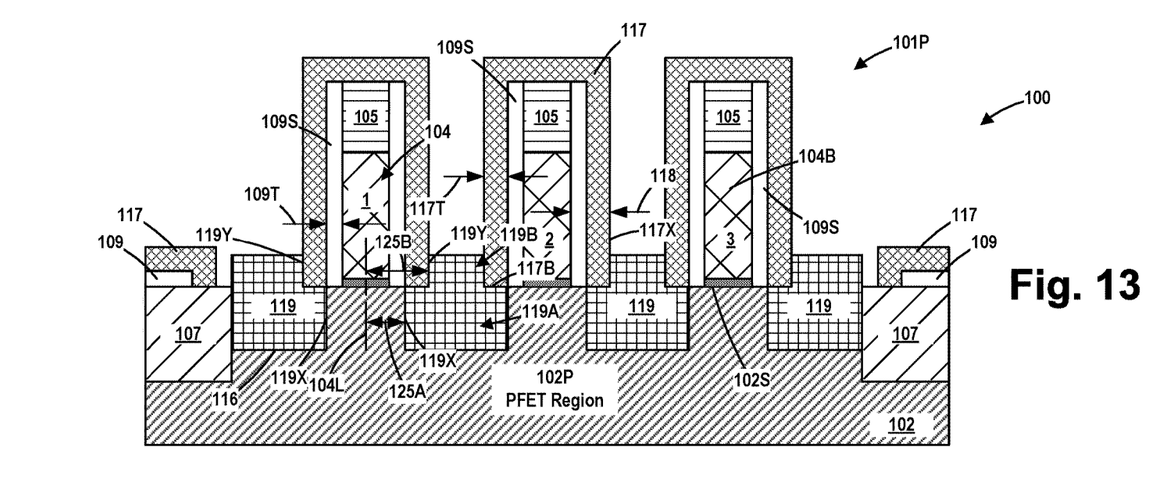
Figure 14:
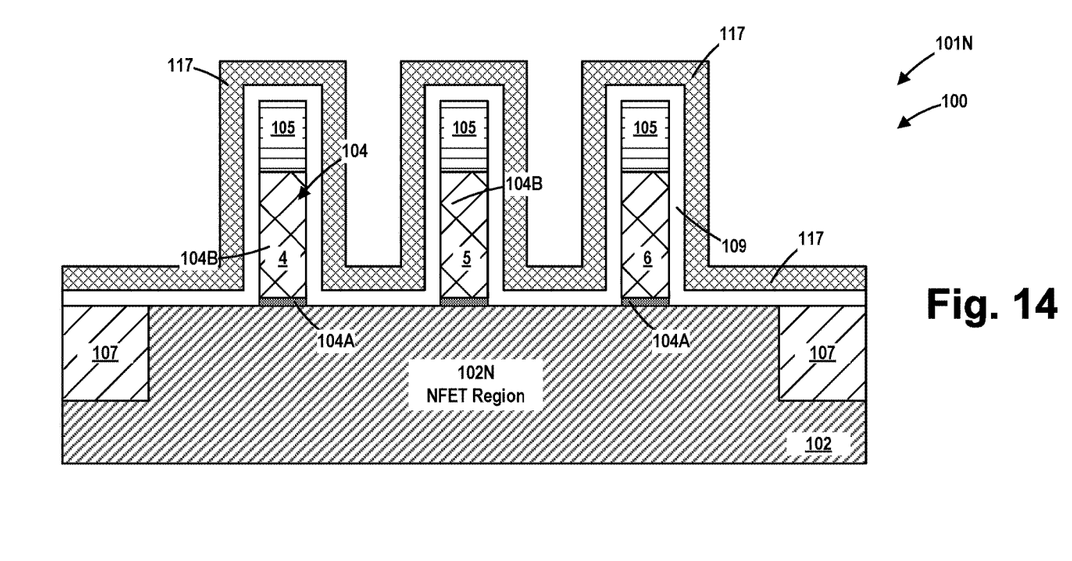

FIGS. 13 and 14 depict the IC product 100 after an epitaxial growth process was performed to form epi semiconductor material 119 for the PFET transistors 101P in the epi cavities 116 in the PFET region 102P. The epi material 119 may be formed to any desired thickness. The epi semiconductor material 119 may comprise any of a variety of semiconductor material, e.g., silicon-germanium, silicon, etc. A first portion 119A of the epi semiconductor material 119 is positioned within the epi cavity 116 (i.e., below the level of the upper surface 102S of the substrate 102), while a second portion 119B of the epi semiconductor material 119 is positioned above the first portion 119A of the epi semiconductor material 119 and above a level corresponding to a level of the upper surface 102S of the semiconductor substrate 102. At this point in the process flow, the second portion 119B of the epi material 119 is positioned between the layers of sacrificial material 117 formed on laterally adjacent gate structures 104. The first portion 119A of epi semiconductor material 119 comprises a first edge 119X that is nearest a centerline 104L of the gate structure 104, while the second portion 119B of the epi semiconductor material 119 comprises a second edge 119Y that is nearest the centerline 104L of the gate structure 104. As depicted, both the first edge 119X and the second edge 119Y are laterally offset from the centerline 104L of the gate structure 104. The first edge 119X is laterally offset from the center line 104L by a distance 125A, while the second edge 119Y is laterally offset from the centerline 104L by a distance 125B, wherein the distance 125B is greater than the distance 125A. In some illustrative embodiments, the difference between the distances 125A and 125B may be about 4-8 nm.

As will be appreciated by those skilled in the art after a complete reading of the present application, in one illustrative embodiment, the thickness 109T of the sacrificial sidewall spacer 109S (at a location near the bottom of the spacer 109S) effectively sets or fixes how close the first edges 119X are positioned to the channel region of the PFET transistors 101P. Additionally, the combined thickness of the spacer 109S and the layer of sacrificial material 117 effectively sets or establishes the lateral distance 118 between what will become the final gate structure for the PFET transistors 101P and the second portion 119B of the epi semiconductor material 119. By optimizing the thickness 109T of the spacer 109S and the distance 118 (the combined thicknesses of the spacer 109S and the material 117), improved parasitic resistance and capacitance between the final gate structure of the device and the epi semiconductor material 119 may be achieved. Also note that, at this point in the process flow, part of the first portion 119A of the epi semiconductor material 119 is positioned vertically below a bottom surface 117B of the first sacrificial material 117 and the outer edge of the second portion 119B of the epi semiconductor material 119 is positioned against an outer side surface 117X of the first sacrificial material 117.

Figure 15:
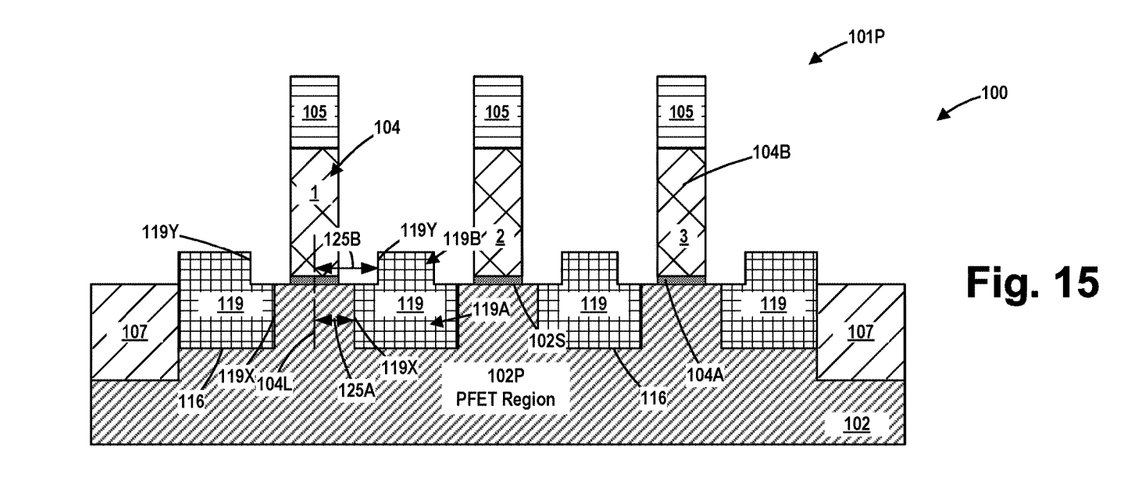
Figure 16:
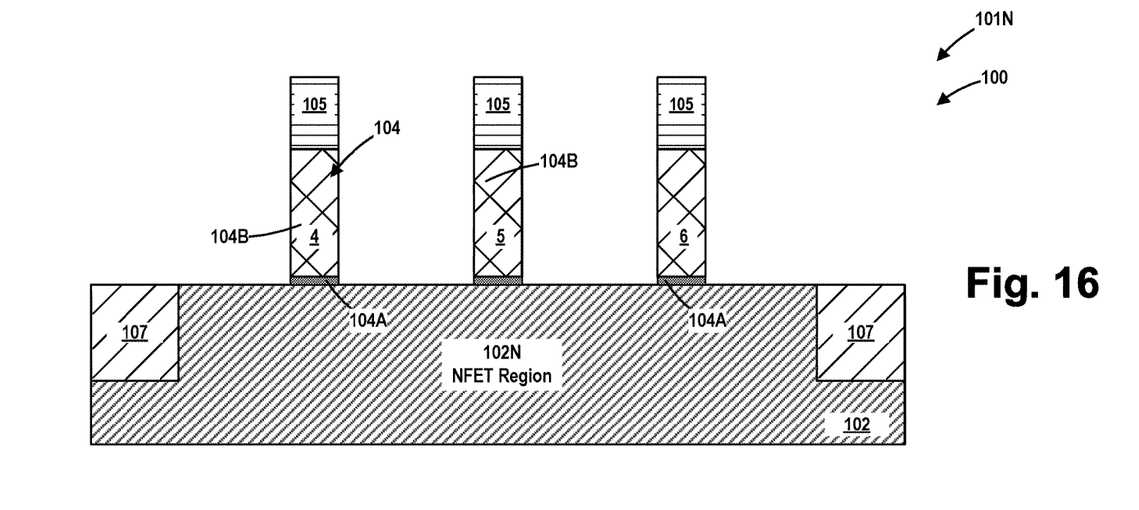

FIGS. 15 and 16 depict the IC product 100 after one or more etching processes were performed to remove the layer of sacrificial material 117 and the sacrificial spacers 109S from the product 100. Performing this process operation also removes the conformal layer of first sacrificial material 117 positioned in the NFET region 102N and the conformal layer of sacrificial spacer material 109 positioned in the NFET region 102N.

Figure 17:
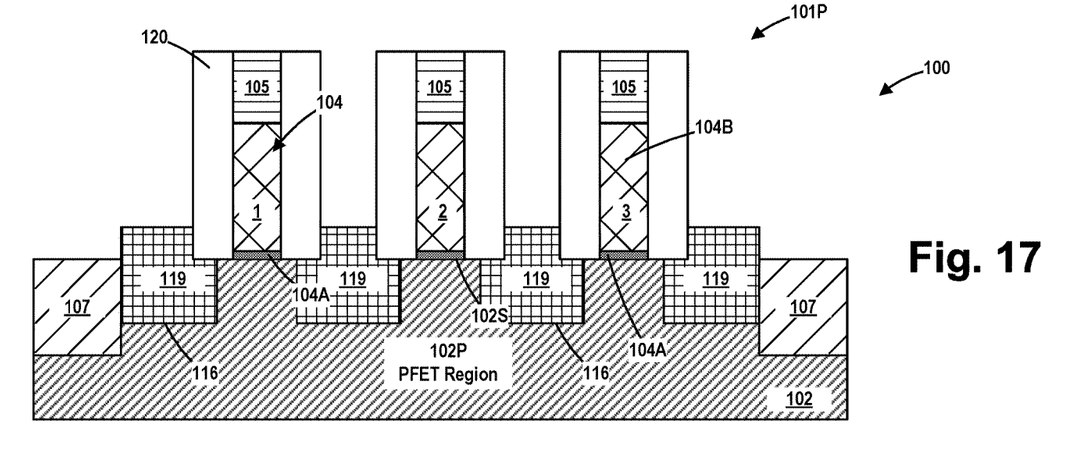
Figure 18:
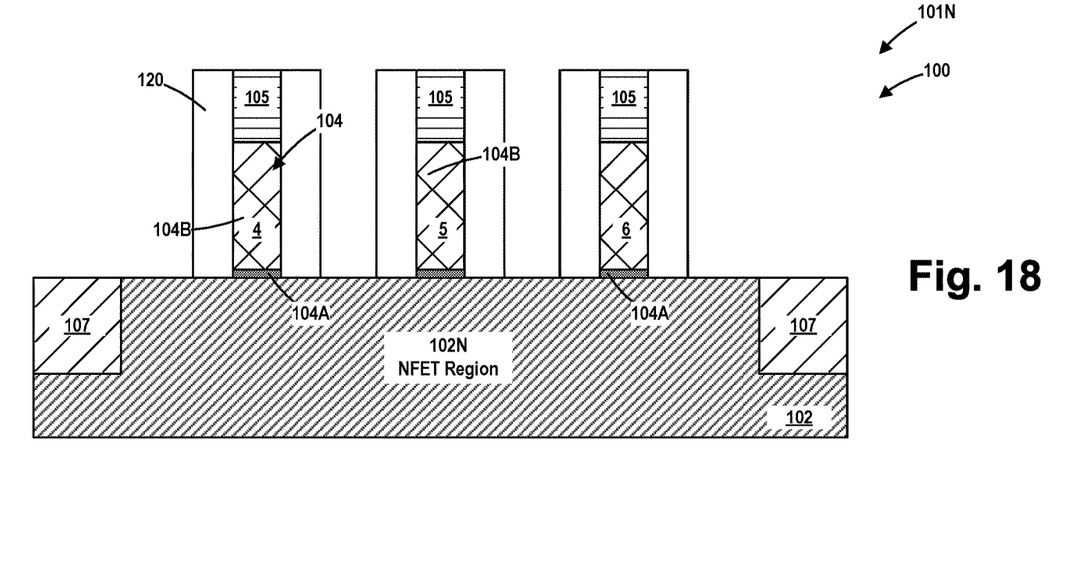

FIGS. 17 and 18 depict the IC product 100 after at least one final sidewall spacer 120 was formed adjacent the PFET transistors 101P and the NFET transistors 101N. The final sidewall spacer 120 may be formed by depositing a conformal layer of spacer material across the product 100 and thereafter performing an anisotropic etching process on the layer of spacer material. The final spacer 120 may be comprised of a variety of different materials, e.g., silicon dioxide, a low-k material (k value of about 3.3 or less), SiOCN, SiBCN, SiOC, etc., and it may be formed to any desired thickness. The final spacer 120 should be understood to be representative in nature in that, instead of a single spacer 120, multiple spacers may be formed adjacent the gate structures 104.

Figure 19:
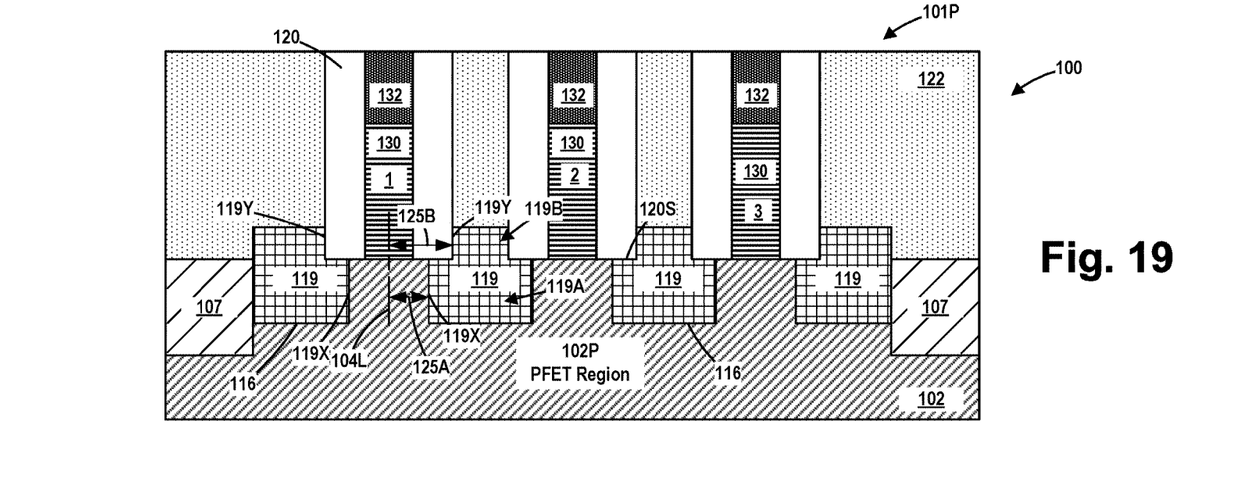
Figure 20:
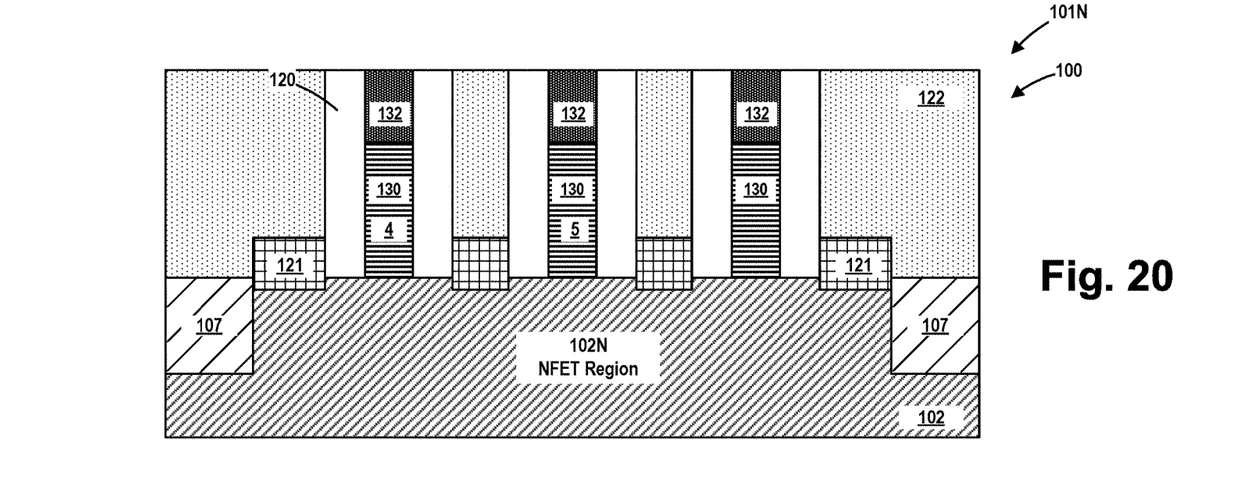

In one illustrative process flow, the method described above may only be performed on the PFET transistors 101P. In such an illustrative process flow, at the point of processing shown in FIGS. 17 and 18, traditional manufacturing processing operations may be performed to complete the manufacture of the product 100 as shown in FIGS. 19 and 20. For example, epi semiconductor material 121 may be selectively formed for the NFET transistors 101N by forming appropriate masking layers (not shown) to expose the NFET region 102N and thereafter performing an epitaxial growth process to form the epi semiconductor material 121 for the NFET transistors 101N. The epi semiconductor material 121 for the NFET transistors 101N may be comprised of a variety of different semiconductor materials, e.g., silicon, silicon-carbon, etc. Thereafter, a conformal contact etch stop layer (not shown) may be formed across the product, followed by the formation of at least one layer of insulating material 122 and performing a CMP process to planarize the upper surface of the sacrificial gate caps 105 (see FIGS. 17 and 18). At that point, traditional replacement-gate manufacturing operations may be performed to form the simplistically depicted final gate structures 130 and final gate caps 132 for the various transistor devices. The gate structures 130 are intended to be representative of any type of gate structure that may be formed for any type of transistor device using any manufacturing technique. The gate structures 130 are typically comprised of a high-k gate insulation layer (not separately shown) such as, hafnium oxide, a material having a dielectric constant greater than 10, etc., and one or more conductive material layers (not separately shown) that function as the gate electrode of the gate structure 130. Of course, the materials of the gate structures 130 for the PFET transistors 101P are typically different from the materials of the gate structures 130 for the NFET transistors 101N. At that point, source/drain metallization structures, e.g., "trench silicide" (TS) structures (not shown), may be formed to conductively contact the epi materials 119, 121 in the source/drain regions of the transistor devices 101P, 101N. Note that a portion of the at least one final sidewall spacer 120 is positioned laterally between the second portion 119B of the epi material 119 and the gate structure 130. Also note that at least a portion of a bottom surface 120S of the at least one final sidewall spacer 120 is positioned on and in contact with a portion of an upper surface of the first portion 119A of the epi material 119.

In another illustrative process flow, the methods disclosed herein may be performed to form epi semiconductor material in the source/drain regions of only the NFET transistors 101N, and traditional manufacturing techniques may be performed to form epi semiconductor materials in the source/drain regions of the PFET transistors 101P.

In yet other process flows, the methods disclosed herein may be performed to form epi semiconductor material in the source/drain regions of both the PFET transistors 101P and the NFET transistors 101N. In this latter example, the formation of the patterned masking layer 115 may be omitted, and the above-described anisotropic etching process may be performed on the entire first conformal layer of sacrificial material 109. As a result, the above-described sacrificial sidewall spacers 109S will be formed adjacent the gate structures (1-3) of the PFET transistors 101P and adjacent the gate structures (4-6) of the NFET transistors 101N. Then, the above-described epi cavities 116 may be formed in the substrate 102 adjacent the gate structures (1-3) of the PFET transistors 101P and adjacent the gate structures (4-6) of the NFET transistors 101N. At that point, the layer of sacrificial material 117 will be formed on sacrificial sidewall spacers 109S and then different epi semiconductor may be formed in the epi cavities 116 for both the PFET transistors 101P and the NFET transistors 101N by forming appropriate masking layers and separate epi deposition processes. Other process flows are also possible.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A transistor, comprising:
   a gate structure positioned above a semiconductor substrate, said semiconductor substrate comprising an upper surface, wherein said transistor has a gate length and wherein, when viewed in a cross section taken through said gate structure in a direction corresponding to a gate length direction of said transistor, said gate structure comprises substantially vertically oriented sidewalls;
   an epi cavity in said semiconductor substrate adjacent said gate structure, said epi cavity comprising substantially vertically oriented sidewalls and a substantially planar bottom surface, said substantially planar bottom surface being oriented substantially normal to said substantially vertically oriented sidewalls of said epi cavity;
   epi semiconductor material comprising first and second portions, said first portion of said epi semiconductor material being positioned within said epi cavity, said second portion of said epi semiconductor material being positioned above said first portion of said epi semiconductor material and above a level corresponding to a level of said upper surface of said semiconductor substrate, said first portion of epi semiconductor material comprising a first edge nearest a centerline of said gate structure, said second portion of epi semiconductor material comprising a second edge that is nearest said centerline of said gate structure, wherein said first and second edges are laterally offset from said centerline of said gate structure by first and second distances, respectively, wherein said second distance is greater than said first distance and wherein said first edge of said first portion of epi semiconductor material is laterally offset from a nearest one of said substantially vertically oriented sidewalls of said gate structure; and
   at least one sidewall spacer positioned adjacent sidewalls of said gate structure, said at least one sidewall spacer comprising a lateral width in said gate length direction and a substantially planar bottom surface that extends throughout the entire lateral width of said at least one sidewall spacer, wherein said substantially planar bottom surface is substantially parallel to said upper surface of said semiconductor substrate, wherein a portion of said at least one sidewall spacer is positioned laterally between said second portion of said epi semiconductor material and said gate structure and a portion of said bottom surface of said at least one sidewall spacer is positioned on and in contact with an upper surface of said first portion of said epi semiconductor material.

2. The transistor of claim 1, wherein said transistor is one of a PFET transistor or an NFET transistor and wherein said second distance is greater than said first distance by at least about 4-8 nm.

3. The transistor of claim 1, wherein said first portion of said epi semiconductor material has a first dimension in a direction corresponding to said gate length direction of said transistor and said second portion of said epi semiconductor material has a second dimension in a direction corresponding to said gate length direction of said transistor, wherein said first dimension is greater than said second dimension.

4. The transistor of claim 1, wherein said transistor is a PFET transistor and wherein said epi semiconductor material comprises one of silicon or silicon-germanium.

5. The transistor of claim 1, wherein said transistor is an NFET transistor and wherein said epi semiconductor material comprises one of silicon or silicon-carbon.

6. A transistor, comprising:
a gate structure positioned above a semiconductor substrate, said semiconductor substrate comprising an upper surface, wherein said transistor has a gate length and wherein, when viewed in a cross section taken through said gate structure in a direction corresponding to a gate length direction of said transistor, said gate structure comprises substantially vertically oriented sidewalls;
an epi cavity in said semiconductor substrate adjacent said gate structure; and
epi semiconductor material comprising first and second portions, said first portion of said epi semiconductor material being positioned within said epi cavity, said second portion of said epi semiconductor material being positioned above said first portion of said epi semiconductor material and above a level corresponding to a level of said upper surface of said semiconductor substrate, said first portion of epi semiconductor material comprising a first edge nearest a centerline of said gate structure, said second portion of epi semiconductor material comprising a second edge that is nearest said centerline of said gate structure, wherein said first portion of said epi semiconductor material has a first dimension in a direction corresponding to said gate length direction of said transistor and said second portion of said epi semiconductor material has a second dimension in a direction corresponding to said gate length direction of said transistor, wherein said first dimension is greater than said second dimension and wherein said first edge of said first portion of epi semiconductor material is laterally offset from a nearest one of said substantially vertically oriented sidewalls of said gate structure.

7. The transistor of claim 6, further comprising at least one sidewall spacer positioned adjacent sidewalls of said gate structure, said at least one sidewall spacer comprising a lateral width in said gate length direction and a substantially planar bottom surface that extends throughout the entire lateral width of said at least one sidewall spacer, wherein said substantially planar bottom surface is substantially parallel to said upper surface of said semiconductor substrate, wherein a bottom portion of said at least one sidewall spacer is positioned laterally between said second portion of said epi semiconductor material and said gate structure and a portion of said bottom surface of said at least one sidewall spacer is positioned on and in contact with an upper surface of said first portion of said epi semiconductor material.

8. The transistor of claim 6, wherein said epi cavity comprises substantially vertically oriented sidewalls and a substantially planar bottom surface that is oriented substantially normal to said substantially vertically oriented sidewalls of said epi cavity.

9. The transistor of claim 7, wherein said first and second edges are laterally offset from said centerline of said gate structure by first and second distances, respectively, wherein said second distance is greater than said first distance.

10. The transistor of claim 9, wherein said second distance is greater than said first distance by at least about 4-8 nm.

11. The transistor of claim 6, wherein said transistor is a PFET transistor and wherein said epi semiconductor material comprises one of silicon or silicon-germanium.

12. The transistor of claim 6, wherein said transistor is an NFET transistor and wherein said epi semiconductor material comprises one of silicon or silicon-carbon.

13. A device, comprising:
a first transistor, said first transistor comprising:
a first gate structure positioned above a semiconductor substrate, said semiconductor substrate comprising an upper surface;
a first epi cavity in said semiconductor substrate adjacent said first gate structure; and
a first epi semiconductor material comprising first and second portions, said first portion of said first epi semiconductor material being positioned within said first epi cavity, said second portion of said first epi semiconductor material being positioned above said first portion of said first epi semiconductor material and above a level corresponding to a level of said upper surface of said semiconductor substrate, wherein said first transistor has a first gate length and wherein said first portion of said first epi semiconductor material has a first dimension in a direction corresponding to a first gate length direction of said first transistor and said second portion of said first epi semiconductor material has a second dimension in a direction corresponding to said first gate length direction of said first transistor, wherein said first dimension is greater than said second dimension; and
a second transistor, said second transistor comprising a second gate structure and a second epi semiconductor material, wherein said second epi semiconductor material is positioned entirely above said upper surface of said semiconductor substrate.

14. The transistor of claim 13, further comprising at least one sidewall spacer positioned adjacent sidewalls of said first gate structure, said at least one sidewall spacer comprising a lateral width in said gate length direction and a substantially planar bottom surface that extends throughout the entire lateral width of said at least one sidewall spacer, wherein said substantially planar bottom surface is substantially parallel to said upper surface of said semiconductor substrate, wherein a bottom portion of said at least one sidewall spacer is positioned laterally between said second portion of said first epi semiconductor material and said first gate structure and a portion of said bottom surface of said at least one sidewall spacer is positioned on and in contact with an upper surface of said first portion of said first epi semiconductor material.

15. The transistor of claim 13, wherein said first transistor and said second transistor are opposite type transistors.

16. The transistor of claim 13, wherein said first transistor and said second transistor are opposite type transistors.

17. The device of claim 14, wherein said first portion of said first epi semiconductor material comprises a first edge nearest a centerline of said first gate structure, said second portion of said first epi semiconductor material comprises a second edge that is nearest said centerline of said first gate structure, wherein said first and second edges of said first epi semiconductor material are laterally offset from said centerline of said first gate structure by first and second distances, respectively, wherein said second distance is greater than said first distance.

18. The device of claim 17, wherein, when viewed in a cross section taken through said first gate structure in a direction corresponding to said first gate length direction of said first transistor, said first gate structure comprises substantially vertically oriented sidewalls and wherein said first edge of said first portion of said first epi semiconductor material is laterally offset from a nearest one of said substantially vertically oriented sidewalls of said first gate structure.

* * * * *